United States Patent [19]

Cook

[11] Patent Number: 5,771,155
[45] Date of Patent: Jun. 23, 1998

[54] SPRING CLAMP ASSEMBLY FOR IMPROVING THERMAL CONTACT BETWEEN STACKED ELECTRONIC COMPONENTS

[75] Inventor: Randolph H. Cook, Gilford, N.H.

[73] Assignee: Aavid Engineering, Inc., Laconia, N.H.

[21] Appl. No.: 707,225

[22] Filed: Sep. 3, 1996

[51] Int. Cl.⁶ .................................................. H05K 7/20
[52] U.S. Cl. .......................... 361/710; 248/510; 257/719; 257/726
[58] Field of Search ............................ 24/458, 510, 518; 165/80.2, 80.3, 185; 174/16.3; 248/510; 257/707, 713, 718–719, 726–727; 361/704, 707, 709–710, 715–722

[56] References Cited

U.S. PATENT DOCUMENTS 3,946,276  3/1976  Braun et al. ............................ 174/16.3
5,402,313  3/1995  Casperson et al. ...................... 361/710

*Primary Examiner*—Gregory D. Thompson
*Attorney, Agent, or Firm*—Cohen, Pontani, Lieberman & Pavane

[57] ABSTRACT

A spring clamp device providing a compressive stress to a stack of components includes a spring member and a bracket having attachment structure for engaging mating structure near the bottom of the stack. The bracket is first engaged with the mating structure such that it straddles the stack. The spring member is then latched to the bracket under tension in an assembled configuration, thereby applying an upward reaction on the mating structure with the attachment structure of the bracket and applying a downward reaction force to the top of the stack with the spring member. The oppositely directed forces apply a compressive stress to the stack, which improves thermal contact between the components.

54 Claims, 6 Drawing Sheets

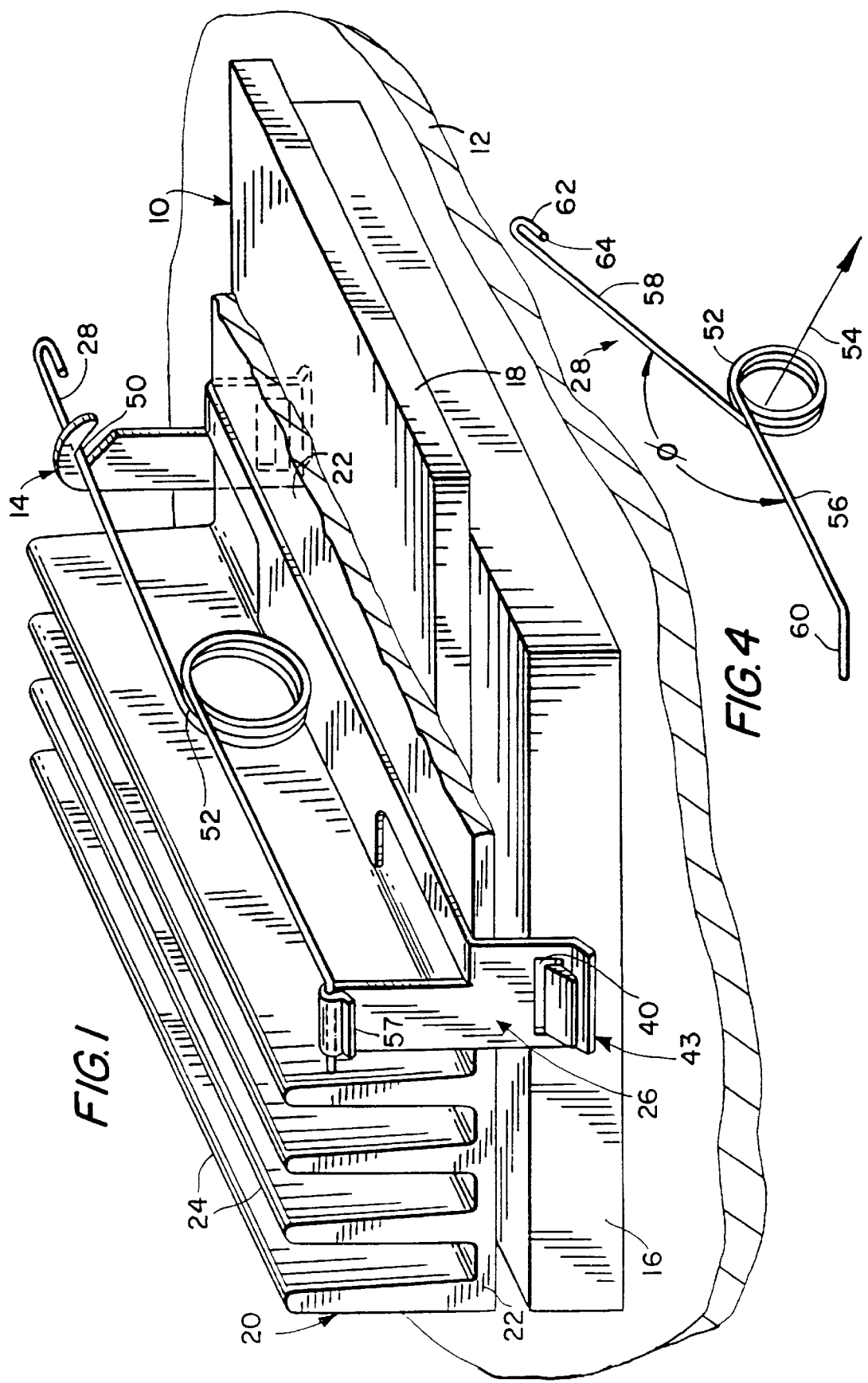

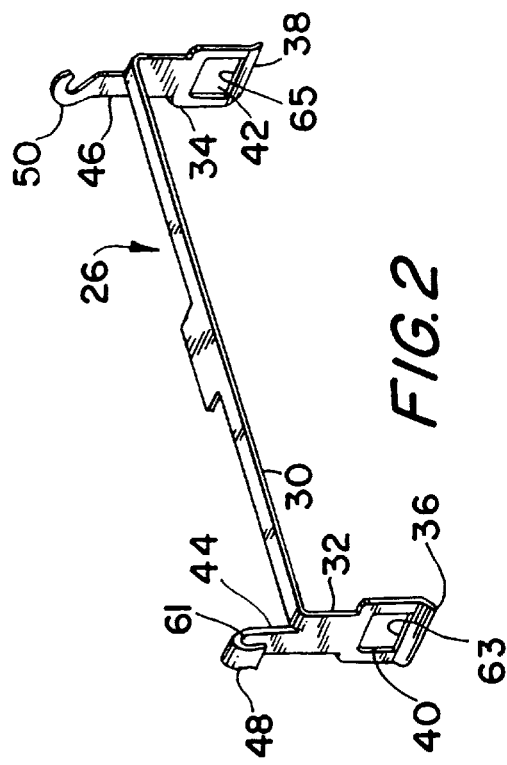
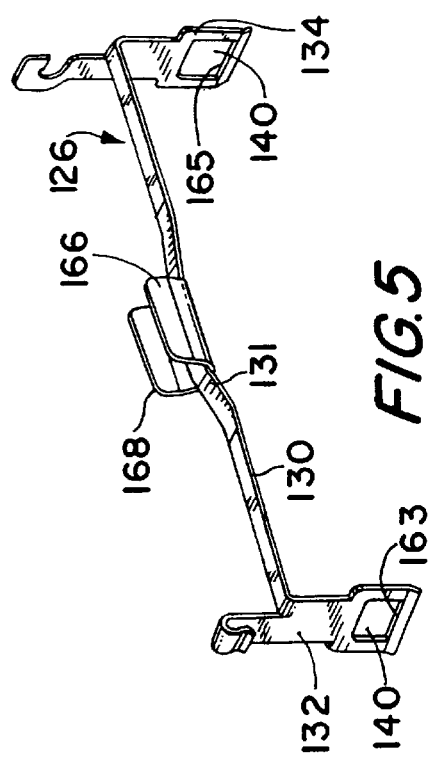
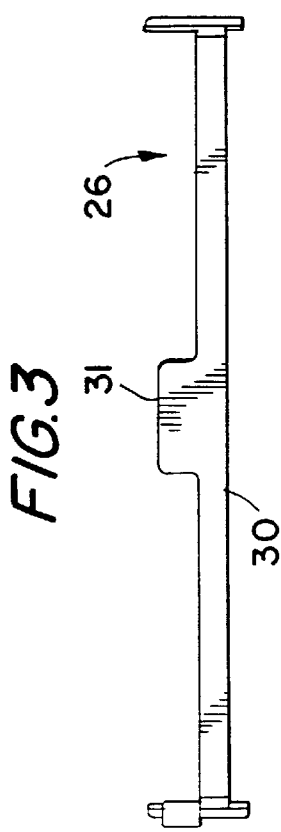
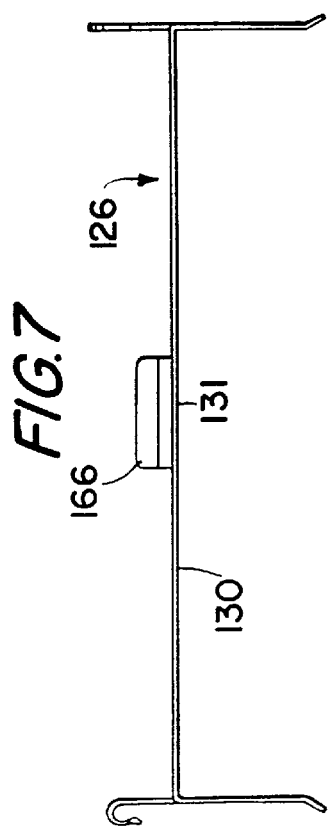

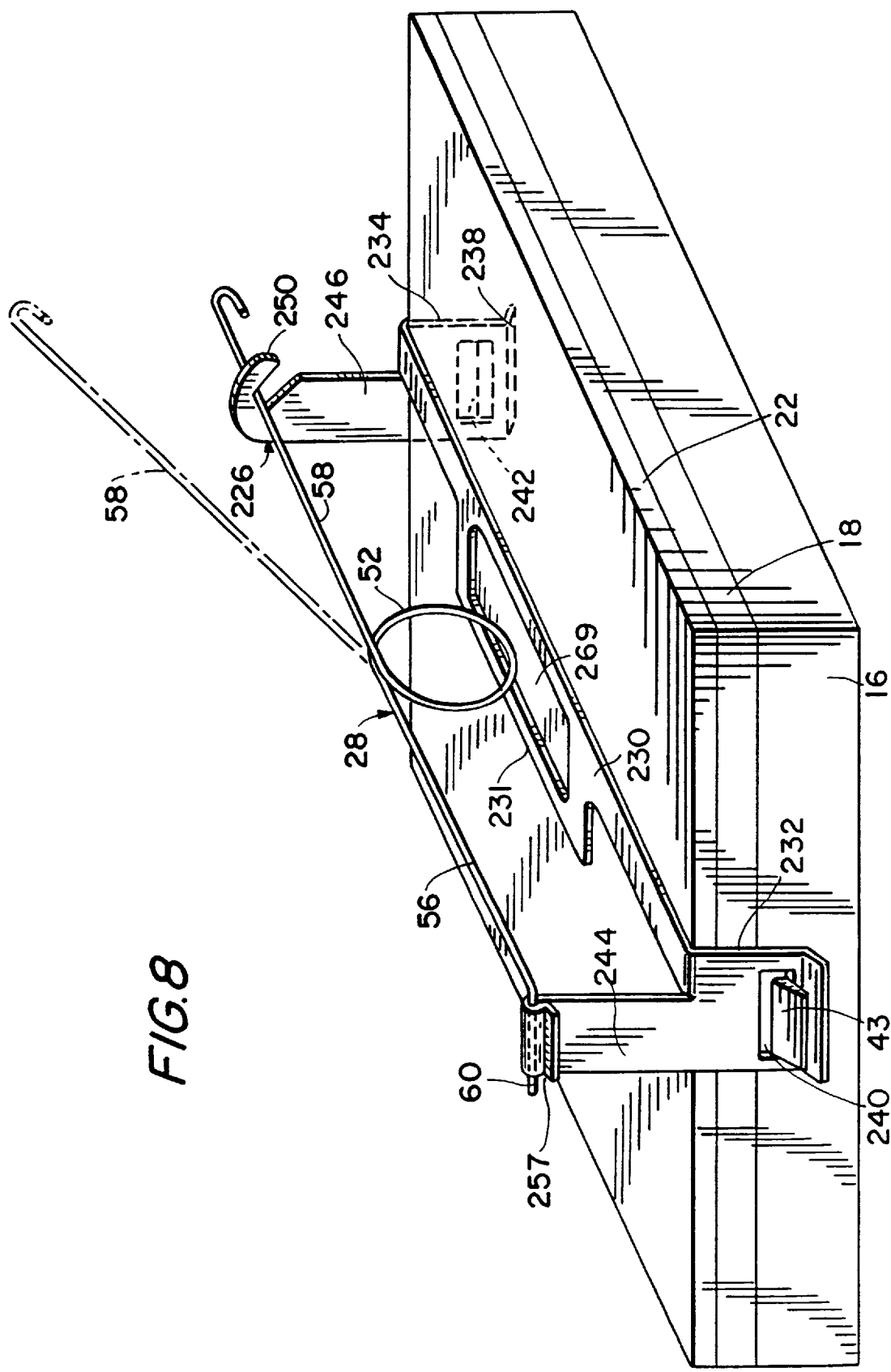

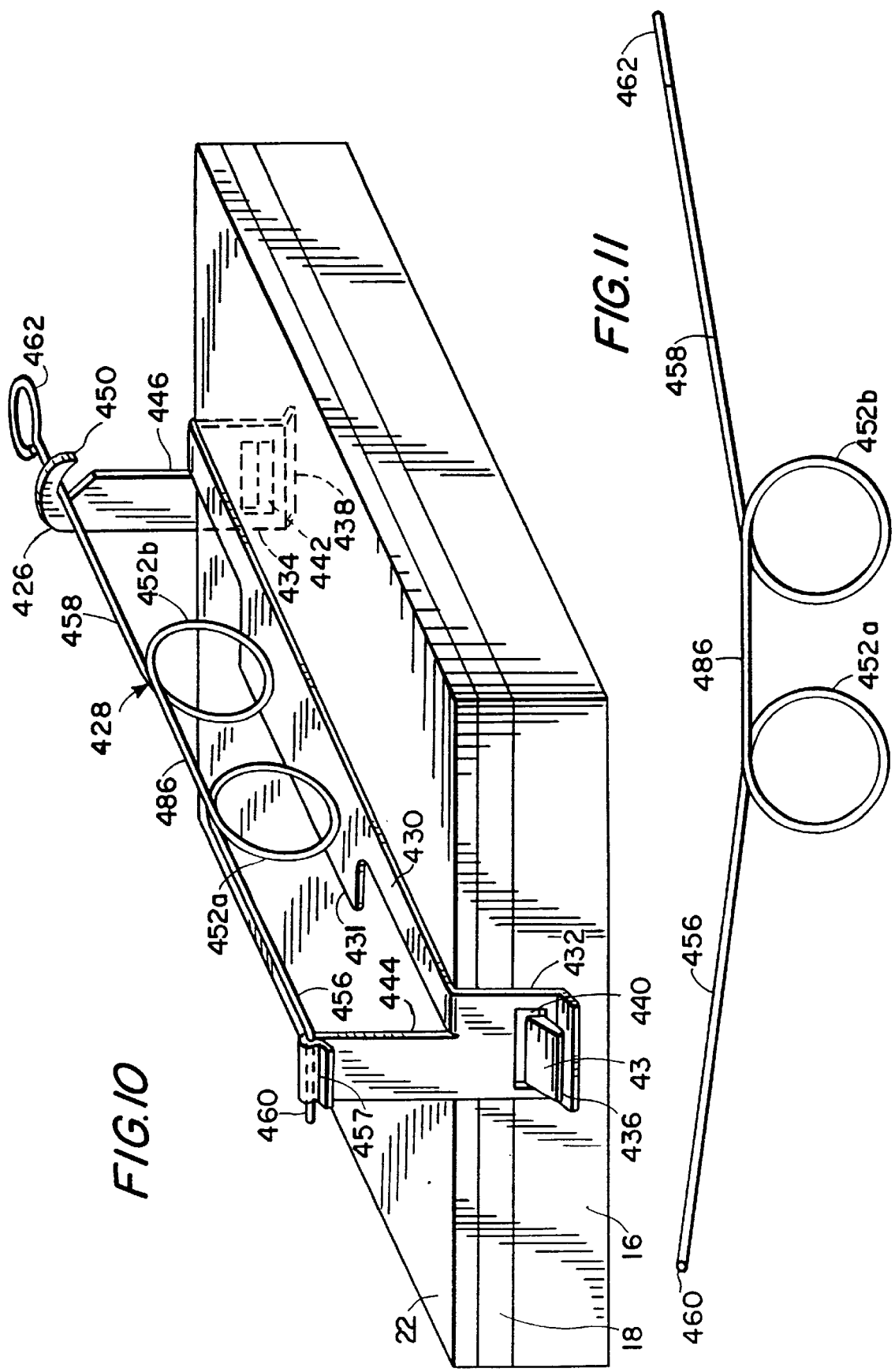

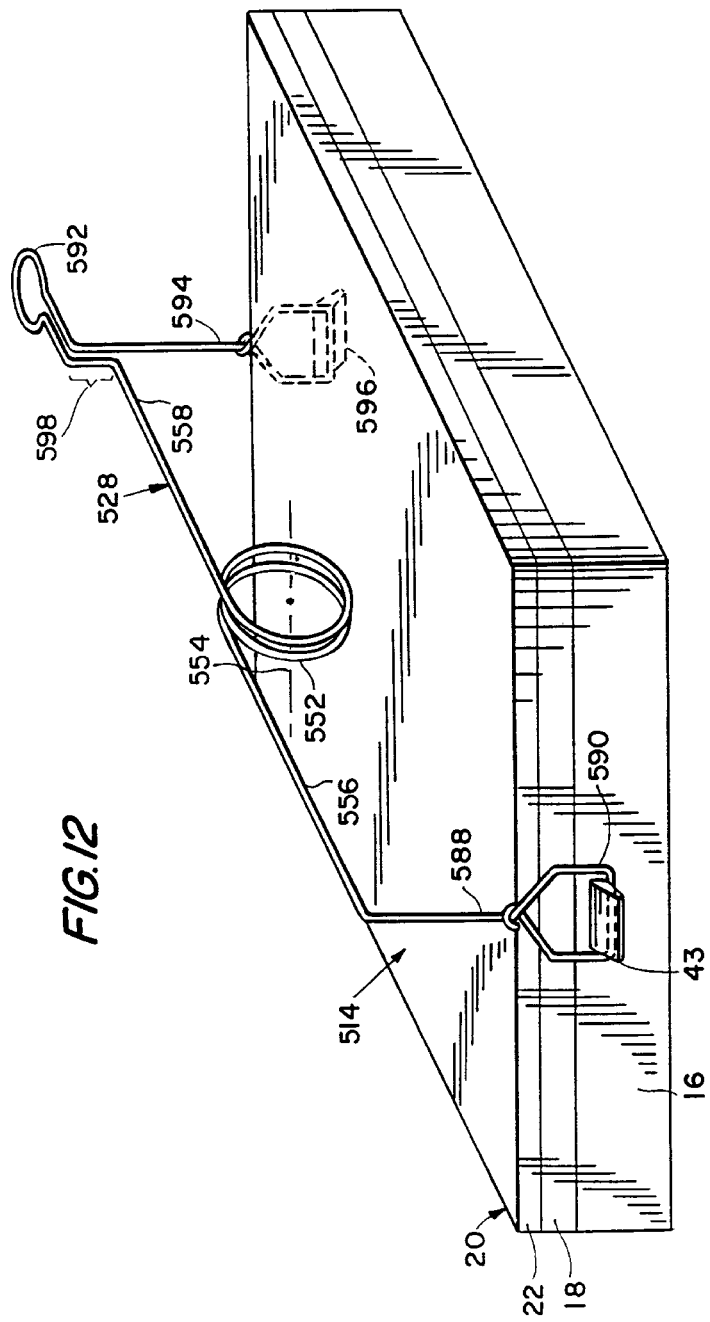

SPRING CLAMP ASSEMBLY FOR IMPROVING THERMAL CONTACT BETWEEN STACKED ELECTRONIC COMPONENTS

BACKGROUND OF THE INVENTION

The invention relates to a spring clamp assembly for applying a compressive force to stacked electronic components, and to a method for improving thermal contact between a heat dissipating device and an adjacent circuit component by clamping them together with the spring clamp assembly.

Electronic components on circuit boards, such as, for example, power transistors and processors, can generate significant amounts of heat which must be removed for the components to operate reliably. Some of the heat can be dissipated through the components' leads. Much of the excess heat, however, is removed to ambient air. Cooling can be improved by thermally coupling a pinned, finned or other heat sink to the circuit component.

In a number of known configurations, a pinned or finned heat sink is mounted with a releasable leaf spring type spring clip on a top surface of a circuit component. The circuit component usually is mounted in a socket which is attached to the circuit board. The ends of the clip may have depending structures that attach to bosses projecting from opposite peripheral sides of the component or of the socket in which the component is mounted. A portion of the clip crossing over the heat sink bears down on the top of the heat sink, applying a compressive stress to the stacked components.

The high forces required to install or remove such clips can damage the underlying circuit board during installation or removal of the clips. Two "failure" mechanisms are understood. First, the end of the clip can contact and damage a trace on the board while installing or removing the clip. Second, some clips require tools for installation and/or removal. The tools may either flex or strike the board and cause damage, especially if the tool is misused or if an improper substitute tool is used. Moreover, the need for a spring clip installation or removal tool is seen as unfavorable in the industry, with or without any risk of damaging circuit boards.

Spring clamps will typically apply a compressive force that is sensitive to a dimensional variation of the stack-up heights of the parts being clamped. Leaf spring type clips have relatively high spring rates, usually in the range of fifty pounds per inch. A change to the stack-up height of only 0.050 inch, which can be within the combined tolerance range of stacked components, would result in a change to the clamping force of approximately 2.5 pounds. Given that target clamping forces for semiconductor components are typically about seven and one half pounds, it can be seen that small variations in stack-up height can significantly affect the performance of prior art clips.

SUMMARY OF THE INVENTION

A clamping device or assembly according to the invention provides a compressive force to stacked electronic components that requires low forces both to install and remove, reducing the risk of damaging an underlying circuit board. The clamping assembly includes a spring with a low spring rate, thereby providing a compressive force that is relatively insensitive to small variations in the stack-up height of the clamped electronic components.

The electronic components can include, for example, a heat dissipating device, such as a pinned or finned sink, an analog or digital circuit device that generates heat during operation, a socket for the circuit device, and the like. In preferred configurations, the heat dissipating device is a top component of the stack, the socket and circuit device are lower components of the stack, and the heat dissipating device will have a surface in contact with the circuit device. The socket may be mounted on a circuit board.

The clamping device includes a torsional spring member including one or more coils and a pair of arms extending from ends of the coil or coils. The spring member is structured to have a relatively low spring rate such that a moderate change in the deflection of the arms causes a small change in the spring tension. This is favorable because it results in a clamping force that is less sensitive to dimensional variation of the stack-up height of the parts being clamped. The clamping device also includes coupling structure including structure for latching to peripheral sides of a lower component of the stack, such as the socket or the circuit device, and for tensioning the coil in a clamped configuration such that a peripheral edge of the coil urges a top component of the stack, such as the heat sink, towards the lower component. The clamped stack forms a heat dissipating assembly.

In an assembled or clamped configuration, the spring member imparts a downward force to a top surface of the top component of the stack, and the coupling structure imparts an upward reaction force to the lower component in the stack, such that the components are clamped together with a compressive force that improves thermal contact between the components. The spring member and the coupling structure can be separate components or they can be fabricated in a single, unitary structure.

According to one aspect of the invention, the coupling structure includes a clip-on bracket that is a separate component from the spring member. The bracket has a cross member that spans across the top component in the assembled configuration. Legs depend down from respective ends of the cross member. Each leg includes a surface for latching to one of the peripheral sides of the first component. The bracket also includes spring engaging members coupled to respective ends of the cross member for engaging one of the arms in the clamped configuration.

In this configuration of the invention, the bracket is clipped into place with the spring member initially in an unstressed state. The spring member is then deflected and latched to the bracket such that the spring member is held in a tensioned, deflected state. The cross member is flexible enough to transmit a downward force from the coil to the top component. The spring tension applies the downward force to the top surface of the top component, which is typically the heat sink, and applies an upward reaction force with the bracket legs to the lower component to which it is clipped.

According to another aspect of the invention, the bracket can have a substantially H-shaped profile. The spring engaging members are coupled to the respective ends of the cross member by respective upright arms extending up from the legs.

The cross member can include a central portion positioned such that the peripheral edges of the coil or coils bear against the central portion in said assembled configuration. In other configurations, the coil or coils bear directly against the top component.

The spring member can be made of spring wire. The bracket can be made of a bent metal stamping.

According to another aspect of the invention, the spring clamp device can be fabricated from a single piece of spring wire.

The geometric and structural design constraints of the spring member are largely divorced from those of the bracket. The invention is therefore very adaptable to both geometric changes to the parts being clamped and to changes of clamping force requirements. A change to the size or shape of the parts being clamped can be accommodated by a relatively simple change to the bracket without necessarily requiring a design change to the spring member. Conversely, if a change to the clamping force is required this can be accomplished with a change to the spring member without necessarily requiring a design change to the bracket. The designer has the freedom to change either the spring member or the bracket without compromising the other.

Relatively low forces are required to secure the bracket to the mounting socket. Latching the spring member to the bracket applies relatively higher forces after the bracket is attached. This approach lessens the likelihood of damaging an underlying circuit board during installation of the clamping device.

BRIEF DESCRIPTION OF THE DRAWING

FIG. 1 is a diagrammatic perspective view of a heat dissipating assembly according to the invention, partially broken away to reveal a spring clamp assembly.

FIG. 2 is a perspective view of a bracket forming part of the spring clamp assembly of FIG. 1.

FIG. 3 is a top plan view of the bracket of FIG. 2.

FIG. 4 is a perspective view of a torsional spring member.

FIG. 5 is a perspective view of another embodiment of a bracket.

FIG. 6 is a top plan view of the bracket of FIG. 5.

FIG. 7 is a front elevation view of the bracket of FIG. 5.

FIGS. 8–10 are perspective views additional embodiments of the invention.

FIG. 11 is a front elevation view of the spring member of FIG. 10.

FIG. 12 is a perspective view of yet another embodiment of the invention.

DETAILED DESCRIPTION OF THE INVENTION

Figure 9:
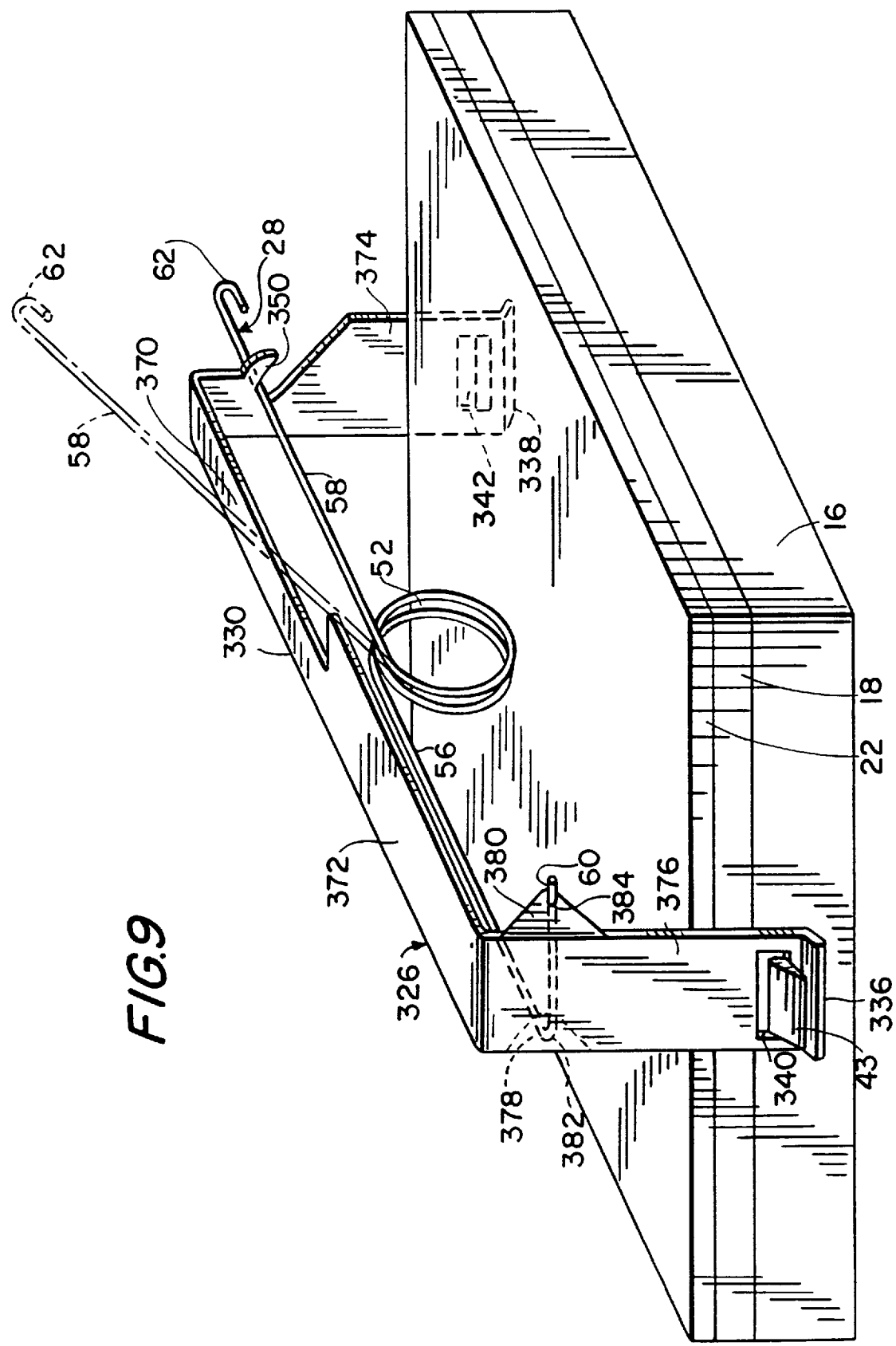

Referring now to FIG. 1, a heat dissipating assembly 10 mounted on a circuit board 12 includes a stack of electronic components held together with a spring clamp device 14. The bottom component of the stack is a socket 16 mounted directly to circuit board 12. The middle component of the stack is an integrated circuit device 18 mounted in socket 16. The top component of the stack is a heat sink 20 positioned on top of circuit device 18. Heat sink 20 has a low profile base 22 and fins 24 extending upward from base 22. Other types of heat sinks having pins or other heat radiating protuberances instead of fins may also be used. Spring clamp device 14 includes two components, an approximately H-shaped bracket 26 and a torsional spring member 28.

The embodiment described below with reference to FIGS. 1–4 is intended to fit within the fins of a 0.5 inches tall heat sink, which has a working height of 0.345 inches under the tops of fins 24 when the 0.155 inches high heat sink base 22 is accounted for. Referring now also to FIGS. 2 and 3, bracket 26 is formed by stamping, bending and heat treating a 0.015 inch thick sheet of 410 stainless steel. Bracket 26 includes a cross member 30 that is approximately 2.53 inches long and approximately 0.10 inches wide for most of its length, and 0.225 inches wide in a broader central portion 31. Legs 32, 34 depend at approximately right angles from ends of cross member 30. Legs 32, 34 have outwardly flared ends 36, 38 and apertures 40, 42 formed adjacent respective flared ends 36, 38. Apertures 40, 42 are designed to engage mounting bosses 43 (only one of which is shown in FIG. 1) projecting out from opposite peripheral sides of socket 16. The distance from the bottom of cross member 30 to the bottom of apertures 40, 42 is approximately 0.424 inches, and apertures 40, 42 are approximately 0.22 inches wide and approximately 0.15 inches high. Upright arms 44, 46 extend above respective legs 32, 34. Upright arms 44, 46 have hooked members 48, 50 formed at their respective ends for retaining spring member 28 in an assembled configuration.

Referring now also to FIG. 4, spring member 28 is a torsion spring made of 0.063 inch diameter music wire that is bent into a desired configuration and heat treated. Spring member 28 includes an approximately two-turn coil 52 with an approximately 0.33 inch major diameter and defining a central axis 54. Spring member 28 includes one coil, but more than one coil (see, e.g., FIGS. 10 and 11 and related description below) may be used to achieve the desired result. Arms 56, 58 extend from coil in directions approximately transverse to central axis 54. In a relaxed, untensioned state, arms 56, 58 define an obtuse included angle φ of approximately 157 degrees. Arm 56 has a straight end 60, approximately 1.34 inches from central axis 54, bent at an approximately right angle to the remainder of arm 56 in a direction about parallel to central axis 54. Straight end 60 fits into a channel 61 (see FIG. 2) defined by hooked member 48 to form a hinge 57 rotatably coupling spring member 28 and bracket 26 at an elevation of approximately 0.2 inches above the bottom surface of cross member 30 (see FIG. 1). The other arm 58 has a curved end 62 for applying downward finger pressure when engaging or disengaging arm 58 and hooked member 50. Tip 64 of curved end 62 is approximately 1.56 inches distant from central axis 54. When engaged with hooked member 50 in the assembled configuration, arm 58 is approximately 0.2 inches elevated above the bottom of cross member 30.

When arm 58 is engaged with hooked member 50 in the assembled configuration, coil 52 bears down against central portion 31 of cross member 30. Cross member 30 is flexible such that the downward force from coil 52 is transmitted through central portion 31 to the top surface of heat sink base 22. At the same time, an upward reaction force is applied to the socket by legs 32, 34, clamping heat sink 20 to circuit device 18.

Assembling spring clamp device 14 to the stacked components can be done without tools. Socket 16 is attached to circuit board 12, and circuit device 18 is mounted in socket 16. Heat sink 20 is placed atop circuit device 18 in a conventional manner. Bracket 26 is then positioned to straddle the stacked components, with cross member 30 spanning the top of heat sink base 22. When a light downward force is applied to bracket 26, moving legs 32, 34 down, flared ends 36, 38 are cammed outward over mounting bosses 43, allowing bosses 43 to snap into engagement with apertures 40, 42. At this point there is little or no clamping force produced, the forces produced by bracket 26 being just sufficient to hold the stack in place during the second stage of installation.

Spring member 28 is presently in a free, or unstressed state. Arm 56 is anchored to the bracket via hinge 57. The other arm 58 is not anchored and extends from coil 52 at an upward angle. The peripheral edge of coil 52 rests against the top of heat sink base 22. In the second stage of assembly, curved end 62 of arm 58 is depressed downward slightly below hook 50 and swung into place to be captured by hooked member 50 on bracket 26. This is done using either a finger or a thumb to supply the downward force.

The tensioned state that the spring member is now held in applies an upward force on legs 32, 34. This force is transferred to bosses 43 by upward facing surfaces 63, 65 at the bottom edges of apertures 40, 42, respectively. Simultaneously, spring member 28 bears against the top of heat sink base 22. The downward force is transmitted from coil 52 through central portion 31 of cross member 30. Cross member 30 is thin enough to be flexible and transmit the downward force. The oppositely directed forces clamp the components of the stack together, thereby applying a compressive stress that increases thermal contact between heat sink 16 and circuit device 18.

It is important to note that the described torsion spring applies its clamping force about in the middle of heat sink base 22, while the point where finger/thumb force is applied to latch spring member 28 is near the perimeter of heat sink base 22. The moment arm produces a mechanical advantage at installation of slightly more than 2:1. The force required to install the clamp is proportionately lower than the clamping force. For example, to produce a clamping force of 7.0 lbs, one need apply only about one half of that to curved end 62 of arm 58 to latch spring member 28.

Removing the spring clamp device 14 can also be done without the aid of tools. Spring member 28 is unlatched by depressing curved end 62 slightly with finger or thumb pressure, and then swinging arm 58 out of engagement with hooked member 50. Bracket can be removed by simultaneously applying downward and inward pressure to hinge 57, which disengages mounting boss 43 from aperture 40. The other mounting boss (not shown) can then be disengaged from aperture 42 by tilting the free end of bracket 26 up.

In the described embodiment, the torsion spring member 28 is designed by specifying the major diameter of coil 52 and the diameter of the wire such that a desired clamping force can be produced while staying within the limitations of the material strength of the wire. The amount of deflection required to produce this clamping force is then set by specifying the number of coils. The selection of coil number therefore effectively sets the spring rate of the device because the clamping force is already specified.

Bracket 26 is designed to be relatively flexible, allowing it to be easily attached to mounting bosses 43 of socket 16 with very light forces, which are much lower than the designed clamping force. Because of bracket's 26 low installation force, it can be designed to make accidental contact with circuit board 12 less likely, and should contact actually occur it would be with a low force.

Bracket's 26 flexibility also allows spring member 28 to transversely deflect cross member 30 for transmitting the downward clamping force to the top of heat sink 20. The scope of the invention, however, is not limited by the interaction between coil 52 and cross member 30. Bracket 26 also can be designed so that coil 52 bears directly on the top of heat sink base 22, not requiring the transverse deflection of cross member 30 (see FIGS. 8 and 9).

Referring now to FIGS. 5–7, another embodiment of a bracket 126 is similar in most respects to bracket 26, but its central portion 131 is about the same width, and laterally offset by about 0.08 inches from the remainder of cross member 130. Central portion 131 includes upstanding side walls 166, 168 forming a saddle that inhibits coil 52 from slipping out of position.

Referring now to FIG. 8, another embodiment of a bracket 226 is also similar in most respects to bracket 26, having a cross member 230, legs 232, 234 with respective apertures 240, 242 and flared tips 236, 238, and upright portions 244, 246 forming, respectively, a hinge 257 and a hook 250. To simplify the drawing, the illustration does not show pins or fins extending upward from heat sink base 22. A central portion 231 of cross member 230 is relieved directly under the bottom of coil 52 such that coil 52 bears directly against the top of heat sink base 22. In the embodiment illustrated in FIG. 8, central portion 231 of cross member 230 defines an aperture 269. In contrast to bracket 26 and bracket 126, bracket 226 may be relatively rigid as it is not required to deflect in order to generate a clamping force on heat sink 20.

FIG. 8 also illustrates in shadow the position of spring member 28 in an untensioned, unlatched position with bracket 226 clipped onto bosses 43 of socket 16.

Referring now to FIG. 9, in yet another embodiment a heat dissipating assembly is shown with solid lines in an assembled configuration wherein spring member 28 is tensioned and locked to a bracket 326. The assembly is also shown in shadow in an unlatched configuration wherein spring member 28 is untensioned and unlocked from bracket 326. The drawing does not show pins or fins on heat sink base 22 to better show the features of bracket 326 and spring member 28. Bracket 326 includes a cross member 330 that extends over the top of spring member 28 such that coil 52 bears directly against the top of heat sink base 22. Overhead cross member 330 has a narrowed portion 370 at one end and a widened portion 372 at the other end. The narrowed portion 370 provides a space for arm 58 of spring member 28 to extend above the level of overhead cross member 330 when in a free and unstressed state. Legs 374, 376 depend at substantially right angles from ends of overhead cross member 330. Leg 376, being adjacent to widened portion 372, includes wings 378, 380 which extend at substantially right angles from leg 376, toward coil 52. Wings 378, 380 each include a respective mounting hole 382, 384 or other structure to engage straight end 60 of spring member 28. Leg 374, being adjacent to narrowed portion 370, includes a hooked member 350 for retaining the other arm 58 of spring member 28 in the assembled configuration. Legs 374, 376 further include outwardly flared ends 336, 338 and apertures 340, 342 formed adjacent respective flared ends 336, 338 for engaging mounting bosses 43.

In the assembled configuration with spring member 28 latched to bracket 326, curved end 62 of arm 58 is locked into place by hooked member 350. In a free and unstressed state, arm 56 is anchored to bracket 326 via mounting holes 382, 384 of wings 378, 380. Arm 58 is not anchored and extends upwardly at an angle adjacent narrowed portion 370.

Referring now to FIG. 10, another embodiment of a heat dissipating assembly includes a spring member 428 latched to a bracket 426 that is clipped onto bosses 43 on opposite peripheral sides of socket 16. Again, fins or pins extending from heat sink base 22 are omitted to simplify the drawing. Spring member 428 is similar in most respects to spring member 28 described above with reference to FIGS. 1–4, but spring member 428 employs two coupled coils 452*a* and 452*b* instead of one. Coils 452*a* and 452*b* are joined by a short straight joining section 486. Arms 456 and 458 extend out from coils 452*a* and 452*b*, respectively. Arm 456 includes a straight section 460 bent at about a right angle from the remainder of arm, and arm 458 includes a loop 462 at its end for applying finger pressure.

Bracket 426 is similar in most features to bracket 26, having a cross member 430, legs 432, 434 with respective apertures 440, 442 and flared tips 436, 438, and upright portions 444, 446 forming, respectively, a hinge 457 and a hook 450. Cross member 430 includes a widened portioned 431 that is longer than widened portion 30 to be able to accommodate both coils 452a, 452b.

In a free and unstressed state (not shown), arm 456 is anchored to bracket 426 via hinge 457, coil 452a contacts central portion 431 of bracket 426, coil joining section 486 extends upward at an angle above the horizontal and holds coil 452b above the surface of central portion 431 with arm 458 extending upward at an angle of substantially the same degree as the angle formed by joining section 486 and arm 456. FIG. 11 illustrates this angular relationship between arm 456, joining member 486 and arm 458 in a free and unstressed state. From the free and unstressed state clamping force is applied in the same manner as described above with reference to FIG. 1. Because spring member 428 has two coils, the downward clamping force is applied at two points rather than at a single point as with previously described embodiments. By using more than one coil, fewer turns are necessary in each coil to obtain the same clamping force. This feature is advantageous when the spacing between fins or pins on a heat sink is narrow.

In any of the above-described two-piece embodiments of this invention, a spring member may be permanently coupled to a bracket, for example, by a hinge, or the spring member and the bracket may be separated components of a set which, when assembled, form a spring clamp device 14.

Referring now to FIG. 12, a unitary embodiment of a spring clamp device 514 is shown. Spring clamp device 514 includes a spring member 528 having a torsion spring coil 552 and arms 556, 558 extending out from coil 552 in directions about transverse to a central axis 554 defined by coil 552. However, rather than engaging a separate bracket, the end of arm 556 is bent downward at a substantially right angle and extends to form a leg 588 which terminates in engaging loop 590. The end of arm 558 is bent up and into a finger loop 592. The wire forming spring clamp device 514 then is bent back down at a substantially right angle from arm 558 to form another leg 594 that also terminates in an engaging loop 596.

Spring clamp device 514 can be clamped onto stacked components 16, 18, 20 without the use of tools. Socket 16 is attached to circuit board 12, digital device/circuit package 18 is mounted in socket 16, and heat sink 20 is placed atop circuit package 18 in a conventional manner. Spring clamp device 514 is installed by attaching engaging loop 590 to mounting boss 43, bringing coil 552 into contact with heat sink base 22 and applying a downward force to thumb loop 592 such that coil 552 contacts heat sink base 22 and engaging loop 596 is secured to the other mounting boss 43 (not shown) on the opposite peripheral side of socket 16.

Spring clamp device 514 can be removed by simultaneously applying a downward and an inward (toward the coil) pressure to loop 592. Upright portion 598 of loop 592 acts as a lever arm to swing loop 596 out and away from the boss 43 (not shown) with which it was engaged. The other loop 590 can then be slipped off of boss 43 to finish removing spring clamp device 514.

Components of a spring clamp assembly according to the invention can be made of different materials than those described above. Both the spring member and the bracket can be made of, for example, a plastic/composite material. Parts can be made by injection molding, welding, casting, and the like. The spring member and bracket could be made separately and later joined, or created as a unit.

The invention provides a clamping force that can be kept within design limits even where the thicknesses of the stacked components may vary. Where the target clamping force is approximately 7.5 lbs, the apparent spring rate at the clamped interface is approximately 20 lbs/in. This means that for a relatively large change to the stack-up height of the clamped parts of say, 0.050", the resulting change to the clamping force would only be approximately 1.0 lbs. In contrast, typical spring rates for prior art spring clamps are in the range of about 50 lbs/in which means that a change of 0.050" to the stack-up height of the clamped parts would result in a change to the clamping force of approximately 2.5 lbs.

The present invention has been described in terms of specific embodiments. However, the invention is not restricted to the embodiments depicted and described. Rather, the scope of the invention is defined by the appended claims.

What is claimed is:

1. A spring clamp device for clamping together a stack of electronic components, comprising:
   a spring member including at least one torsion spring coil;
   a first component of said stack having peripheral sides;
   coupling means including structure for latching to said peripheral sides of said first component of said stack, said spring member further including a first connecting member for operatively connecting said spring coil to said coupling means at one of said peripheral sides and a second connecting member for operatively connecting said spring coil to said coupling means at another of said peripheral sides for tensioning said at least one coil in a clamped configuration such that a peripheral edge of said at least one coil urges a second component of said stack against said first component.

2. The spring clamp device of claim 1, wherein said said first connecting member and said second connecting member comprise a pair of arms extending from ends of said at least one coil, and wherein said coupling means includes a bracket comprising a cross member, legs depending from respective ends of said cross member, each leg including a surface for latching to one of said peripheral sides, and spring engaging members coupled to respective ends of said cross member for engaging one of said arms in said clamped configuration.

3. The spring clamp device of claim 2, wherein said spring engaging members are coupled to said respective ends of said cross member by respective upright arms extending up from said legs.

4. The spring clamp device of claim 2, wherein said surface for latching of each leg comprises an edge of an aperture formed in said leg, said apertures being structured for placement over respective bosses projecting from peripheral sides of the first component.

5. The spring clamp device of claim 4, wherein each leg includes an outwardly flared end.

6. The spring clamp device of claim 2, wherein said cross member comprises a central portion positioned such that said at least one coil bears against said central portion in said clamped configuration.

7. The spring clamp device of claim 6, wherein said central portion is wider than portions adjacent said central portion.

8. The spring clamp device of claim 6, wherein said central portion is laterally offset from an adjacent portion of said cross member.

9. The spring clamp device of claim 6, wherein said central portion includes structure for stabilizing said at least one coil in said clamped configuration.

10. The spring clamp device of claim 5, wherein said cross member is structured such that in said clamped configuration said at least one coil bears directly against said second component.

11. The spring clamp device of claim 10, wherein said cross member includes a central portion relieved under said at least one coil in said clamped configuration.

12. The spring clamp device of claim 10, wherein said cross member is positioned over said at least one coil distal said second component in said clamped configuration.

13. The spring clamp device of claim 12, wherein said cross member includes a narrowed portion and a widened portion, wherein said spring engaging members are formed on said legs.

14. The spring clamp device of claim 8, wherein one of said spring engaging members comprises a hooked member for releasably engaging one of said arms of said spring member.

15. The spring clamp device of claim 14, wherein the other of said spring engaging members comprises a hinge rotatably engaging the other of said arms of said spring member.

16. The spring clamp device of claim 1, wherein said spring member and said coupling means are formed of a single length of wire.

17. A spring clamp device for improving thermal contact between members of a stack of electronic components in an clamped configuration with the stack, comprising:
   a torsion spring, including:
      a coil having a central axis transverse to the direction of the compressive stress in the assembled configuration; and
      a pair of spring arms extending outward from ends of the coil and defining an obtuse included angle; and
   a bracket having an approximately H-shaped profile, including:
      a cross member structured to span across a top component of the stack in the clamped configuration;
      a leg depending downward from each end of the cross member and next to a side of the stacked components when spanned by the cross member, each leg comprising a surface for engaging a lower component of the stack below the top component; and
      an upright arm extending upward from each end of the cross member, an upper end of each arm forming a spring engaging member for engaging a respective one of the spring arms, configured such that the spring is tensioned in the clamped configuration, in which the bracket spans the stacked components, the legs engage with the lower component and both spring arms engage with the spring engaging members, and such that a peripheral edge of the coil urges the top component toward the lower component to produce a compressive stress in the stack, whereby thermal contact between the components is improved.

18. The assembly of claim 17, wherein one of the spring engaging members forms a hinge with one of the spring arms.

19. The assembly of claim 17, wherein the bracket comprises a metal stamping and the spring comprises music wire.

20. A heat dissipating assembly, comprising:
   an electronic device generating thermal energy during operation;
   a heat sink mounted on top of the electronic device;
   a spring clamp device including a torsion spring member comprising at least one coil and coupling means comprising structure for latching to peripheral sides of one of the electronic device and a socket in which the electronic device is mounted and for tensioning the at least one coil in a clamped configuration such that a peripheral edge of the at least one coil urges the heat sink against the electronic device.

21. The heat dissipating assembly of claim 20, wherein the latching structure latches to bosses projecting from the peripheral sides of the one of the electronic device and the socket.

22. The heat dissipating assembly of claim 21, wherein the spring member further includes a pair of arms extending from ends of the at least one coil, and wherein the coupling means comprises a bracket, including a cross member, legs depending from respective ends of the cross member, each leg including an aperture having an edge for latching to one of the bosses, and spring engaging members coupled to respective ends of the cross member for engaging one of the arms in the clamped configuration.

23. The heat dissipating assembly of claim 21, further comprising a circuit board on which the socket is mounted.

24. The heat dissipating assembly of claim 22, wherein the cross member comprises a central portion positioned such that the at least one coil bears against the central portion in the clamped configuration.

25. The heat dissipating assembly of claim 24, wherein the central portion is wider than portions adjacent the central portion.

26. The heat dissipating assembly of claim 24, wherein the central portion is laterally offset from an adjacent portion of the cross member.

27. The heat dissipating assembly of claim 24, wherein the central portion includes structure for stabilizing the at least one coil in the assembled configuration.

28. The heat dissipating assembly of claim 22, wherein the cross member is structured such that in the clamped configuration the at least one coil bears directly against the heat sink.

29. The heat dissipating assembly of claim 28, wherein the cross member includes a central portion relieved under the at least one coil in the assembled configuration.

30. The heat dissipating assembly of claim 28, wherein said cross member is positioned over the at least one coil distal the heat sink component in the assembled configuration.

31. The heat dissipating assembly of claim 30, wherein the spring engaging members are formed on the legs.

32. The heat dissipating assembly of claim 26, wherein one of the spring engaging members comprises a hooked member for releasably engaging one of the arms of the spring member, and wherein the other of the spring engaging members comprises a hinge rotatably engaging the other of the arms of the spring member.

33. The heat dissipating assembly of claim 23, wherein the spring member and the coupling means are formed of a single length of wire.

34. A method of improving thermal contact between an electronic device and a heat sink, comprising:
   positioning the heat sink on top of the electronic device;
   attaching a bracket to opposite sides of the electronic device;
   linking a torsional spring member to the bracket under tension, producing an upward reaction on the electronic device and producing a downward reaction on the top of the heat sink.

35. A method of improving thermal contact between an electronic device and a heat sink, comprising:

mounting the electronic device in a socket having mounting bosses projecting from opposite peripheral sides;

positioning the heat sink on top of the electronic device;

straddling the heat sink with a bracket comprising a cross member, legs depending from the cross member, and spaced apart spring engaging members at opposite ends of the cross member;

engaging the legs to the mounting bosses by pressing the bracket downwards toward a top of the heat sink; and latching a torsion spring member to the spring engaging members under tension, to apply an upward reaction force on the socket with the legs and to apply a downward reaction force to the top of the heat sink with the spring member.

36. The method of claim 35, further comprising mounting the socket on a circuit board prior to linking the torsion spring member.

37. The method of claim 35, wherein engaging the legs comprises engaging an aperture formed in each leg with a corresponding one of the mounting bosses.

38. The method of claim 37, wherein the torsion spring member includes an arm coupled to one of the legs, and wherein latching the torsion spring member comprises engaging another arm to a hook member coupled to the other leg, such that a central portion of the torsion spring member between the arms applies the downward reaction force.

39. The method of claim 38, wherein the torsion spring member comprises a torsion spring.

40. The method of claim 38, wherein applying the downward reaction force comprises transmitting the downward reaction force from the spring member to the top of the heat sink through the cross member.

41. A spring clamp device for clamping together a stack of electronic components that includes a top component and a lower component below said top component, comprising:

a torsion spring, including a coil having a central axis and arms extending outward from respective ends of said coil, said arms being in a first angular relation when said torsion spring is in a relaxed configuration; and coupling means including first structure for latching to opposite peripheral sides of said lower component and second structure for latching said torsion spring in an assembled configuration clamping said stack wherein said arms are in a second angular relation relatively rotated from said first angular relation, said coil in said assembled configuration urging said top component towards said lower component to thereby clamp together said stack of electronic components.

42. The spring clamp device of claim 41, wherein said coupling means comprises a bracket.

43. The spring clamp device of claim 42, wherein said bracket comprises a cross member adapted to straddle the stack, said first structure comprises a leg extending from each end of said cross member, each leg including a surface configured for engaging said peripheral side of said lower component, and said second structure comprises a spring engaging member coupled to each end of said cross member for engaging a respective one of said arms in said assembled configuration.

44. The spring clamp device of claim 43, wherein said cross member comprises a central portion positioned such that said coil bears against said central portion in said assembled configuration.

45. The spring clamp device of claim 44, wherein said central portion is wider than portions adjacent said central portion.

46. The spring clamp device of claim 44, wherein said central portion is laterally offset from an adjacent portion of said cross member.

47. The spring clamp device of claim 44, wherein said central portion includes structure for stabilizing said coil in said assembled configuration.

48. The spring clamp device of claim 43, wherein said cross member is structured such that in said assembled configuration said coil bears directly against said top component.

49. The spring clamp device of claim 48, wherein said cross member includes a central portion relieved under said coil in said assembled configuration.

50. The spring clamp device of claim 48, wherein said cross member is positioned over said coil distal said top component in said assembled configuration.

51. The spring clamp device of claim 50, wherein said cross member includes a narrowed portion and a widened portion, wherein said spring engaging members are formed on said legs.

52. The spring clamp device of claim 43 wherein each spring engaging member is formed on an upright arm extending over one of said legs, said bracket having a substantially H-shaped profile.

53. The spring clamp device of claim 43, wherein one of said arms is rotatably coupled to one of said spring engaging members.

54. The spring clamp device of claim 41, wherein said torsion spring includes more than one coil.

* * * * *